United States Patent
Chen et al.

(10) Patent No.: US 9,608,605 B2
(45) Date of Patent: Mar. 28, 2017

(54) APPARATUS AND SCHEME FOR IO-PIN-LESS CALIBRATION OR TRIMMING OF ON-CHIP REGULATORS

(71) Applicant: Futurewei Technologies, Inc., Plano, TX (US)

(72) Inventors: Wei Chen, San Diego, CA (US); Tongzeng Yang, San Diego, CA (US); Chukwuchebem Chinemelum Orakwue, San Diego, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/820,380

(22) Filed: Aug. 6, 2015

(65) Prior Publication Data

US 2017/0040985 A1    Feb. 9, 2017

(51) Int. Cl.
*H03K 5/00* (2006.01)
*H03K 5/003* (2006.01)
*H03K 3/03* (2006.01)
*H03K 5/26* (2006.01)

(52) U.S. Cl.
CPC ........... *H03K 5/003* (2013.01); *H03K 3/0315* (2013.01); *H03K 5/26* (2013.01)

(58) Field of Classification Search
CPC ............................ H03L 7/00995; H03L 7/083

USPC ..................................... 327/50, 322, 73, 415
See application file for complete search history.

(56) References Cited

U.S. PATENT DOCUMENTS

| 6,002,991 A | 12/1999 | Conn, Jr. |
| 6,294,962 B1 | 9/2001 | Mar |
| 6,850,125 B2 | 2/2005 | Norman et al. |
| 8,068,752 B2 * | 11/2011 | Sugiyama .......... G03G 15/0813 399/228 |
| 8,552,795 B2 * | 10/2013 | Chi .................. H03K 19/00384 323/907 |
| 2003/0098733 A1 | 5/2003 | Saita |
| 2005/0253658 A1 | 11/2005 | Maeda et al. |
| 2010/0164476 A1 | 7/2010 | Molchanov et al. |

FOREIGN PATENT DOCUMENTS

| CN | 101399504 A | 4/2009 |
| CN | 104156024 A | 11/2014 |

* cited by examiner

*Primary Examiner* — Dinh T Le
(74) *Attorney, Agent, or Firm* — Slater Matsil, LLP

(57) ABSTRACT

A method and apparatus for measuring a voltage are disclosed. In an embodiment a method for controlling a supply voltage includes providing a first periodic signal by providing a reference voltage to an oscillator, providing a second periodic signal by providing the supply voltage ($V_{OUT}$) of a voltage source to the oscillator, providing a first count by measuring first periods of the first periodic signal, providing a second count by measuring second periods of the second periodic signal and comparing the first count with the second count.

19 Claims, 3 Drawing Sheets

… (US 9,608,605 B2)

APPARATUS AND SCHEME FOR IO-PIN-LESS CALIBRATION OR TRIMMING OF ON-CHIP REGULATORS

TECHNICAL FIELD

The present invention relates generally to a system and method for I/O pin-less calibration or trimming of on-chip regulators, and, in particular embodiments, to a system and method for I/O pin-less calibration or trimming of on-chip low dropout voltage regulators (OCLDOs).

BACKGROUND

Many mobile devices use multi-core or multi-processor systems for high-performance and low-power operation. These mobile devices have many power domains on the chip and on-chip low dropout voltage regulators (LDOs) are widely used to provide these power domains.

SUMMARY

In accordance with an embodiment of the present invention, a method for controlling a supply voltage includes providing a first periodic signal by providing a reference voltage to an oscillator, providing a second periodic signal by providing the supply voltage ($V_{out}$) of a voltage source to the oscillator, providing a first count by measuring first periods of the first periodic signal, providing a second count by measuring second periods of the second periodic signal and comparing the first count with the second count.

In accordance with a further embodiment of the present invention, a circuit includes an oscillator configured to provide a first periodic signal from a first incoming signal and a second periodic signal from a second incoming signal, a counter configured to count first periods of the first periodic signal and second periods of the second periodic signal, and a comparator configured to compare a first count with a second count.

In accordance with yet another embodiment of the present invention, a chip includes a first processing unit, an first on-chip low drop out voltage regulator (OCLDO) providing an output voltage for the first processing unit, and a voltage control circuit electrically connected to the first processing unit and the first OCLDO, wherein the voltage control circuit is configured to control the output voltage of the OCLDO, and wherein the voltage control circuit does not provide a signal to a pin of the chip.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

A problem with the conventional on chip LDOs (or OCLDO) is how to test output signals of these OCLDOs without routing these signals out of the chip (e.g., without providing an additional pin). For example, when the output signal of the LDO (such as the IDLE_OCLDO) is not controlled, the accuracy of the output signal suffers significantly and the power saving of the chip suffers correspondingly. Providing an additional pin or additional pins cost(s) real estate which may not be available at current dimensions. Alternatively, available pins can be used from more advantageous purposes than just providing testing functions. However, without testing and calibrating the accuracy of the voltage regulator is not acceptable because of its high power consumption.

Embodiments of the present invention provide a pin-less measurement, control and calibration circuit for a voltage regulator. Embodiments of the present invention further provide a method for measuring, controlling and calibrating a voltage regulator.

The power consumption of (battery operated) chips may need to be controlled to provide efficient power management. A chip typically uses a voltage regulator to provide a specific voltage domain. The chip may operate most efficiently at a specific operating point or operating range. These operating points/ranges may depend on the supply voltage and other environmental parameters such as temperature and load of the chip. In order to operate the chip most accurately and most efficiently the supply voltage of the voltage regulator, among other parameters, may need to be controlled and if needed adjusted.

Modern chips may include several processors, each of which may comprise multiple execution units (cores) or controllers and may need several voltage domains. Voltage regulators may provide these voltages domains and each voltage regulator may need to be controlled, adjusted, calibrated or trimmed.

In some embodiments the voltage regulator is a capless on-chip LDO (OCLDO) and the measurement circuit is a pin-less measurement or control circuit. Accordingly, the trimming or calibration of the capless OCLDO does not need any additional pin. In other words no extra pin is needed in order to control, measure, calibrate and trim the voltage regulator.

Figure 1:
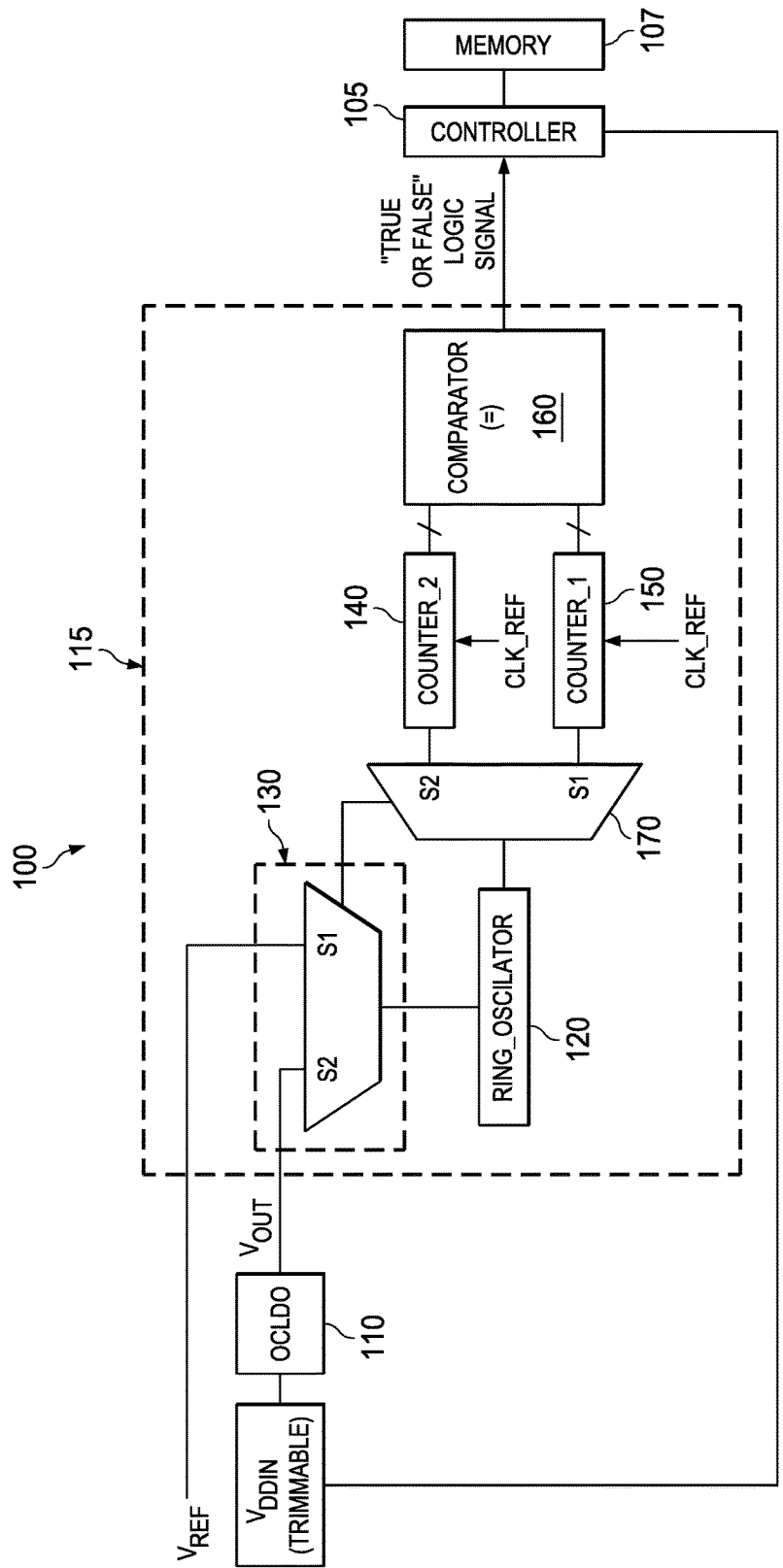
FIG. 1 shows a voltage measurement circuit according to an embodiment.

FIG. 1 shows an integrated chip (IC) 100 comprising a controller 105, a voltage regulator (e.g., OCLDO) 110 and a voltage control or measurement circuit 115. The voltage control circuit 115 comprises an oscillator such as a ring oscillator 120, a selector 130, a first counter 140, a second counter 150, a comparator 160 and a further selector 170. The controller 105 may be part of a calibration circuit that calibrates the supply voltage (output voltage) of the voltage regulator 110. The controller 105 may calibrate or trim the voltage regulator 110 so that an operating range or an operating point of the IC 100 is accurately set and controlled in spite of process, temperature, power supply and load variations.

The voltage regulator 110 may have three terminals. An unregulated input voltage $V_{DDIN}$ is provided at a first terminal, a reference voltage is provided at a second terminal and a regulated output (supply voltage) $V_{OUT}$ is provided at a third terminal. The oscillator 120 may have at least two terminals. A first terminal, an input terminal, can be connected to the output terminal of the voltage regulator 110 via the selector 130 or to a reference voltage, $V_{REF}$, also via the selector 130. A second terminal, an output terminal, may provide an output signal comprising a recurring or periodic signal such as a voltage having a certain frequency.

The selector 130 may be a multiplexer (MUX). Alternatively, the selector may be a switch or switch combination. The MUX may selectively connect the output terminal of the voltage regulator 110 to the oscillator 120 or the reference voltage $V_{REF}$ to the oscillator 120. Alternatively, when a switch S2 is closed and a switch S1 is open, the oscillator 120 is connected to the output terminal of the voltage regulator 110 and provided with the output voltage $V_{OUT}$ and when the switch S2 is open and the switch S1 is closed the oscillator 120 is connected to a reference voltage input and provide with a reference voltage $V_{REF}$. The switches may be switched such that the reference voltage is connected to the oscillator 120 for a first period of time and the output voltage of the voltage regulator 110 for a second period of time. The time periods may not overlap.

The switches S1 and S2 may be the same switches or different switches. The switches S1, S2 may be semiconductor switches or other suitable types of switches. However, these devices are shown for illustration purposes and other selection devices may be used.

The output terminal of the oscillator 120 is connected to counters 140, 150. The counters 140, 150 may be two counters or a single integrated counter. The output of the oscillator 120 may be connected to the counters 140, 150 via the further selector 170. The selector 170 may be a demultiplexer (DEMUX). Alternatively, the further selector 170 may be a switch or switch combination. Similar to the input selector 130, the output selector 170 may comprise a first switch and a second switch. The switches may be the same switches or different switches. The switches may be semiconductor switches or other suitable types of switches. However, these devices are shown for illustration purposes and other selection devices may be used.

The oscillator 120 provides an analog output signal having a recurring or periodic signal such as voltage with a certain frequency. The frequency may depend on the voltage applied to the input terminal(s) of the oscillator 120. The higher the input voltage the higher the frequency of the output of the oscillator 120 and the lower input voltage the lower the frequency of the output voltage of the oscillator 120. The selector (e.g., DEMUX) 170 may connect the output terminal of the oscillator 120 to the input terminal of the first counter 140 when the selector 130 (e.g., switch S1 is closed) connects the reference terminal ($V_{REF}$) to the oscillator 120 and may connect the output terminal of the oscillator 120 to the second counter 150 when the selector (e.g., second switch S2 is closed) connects the output voltage ($V_{OUT}$) of the voltage regulator 110 to the oscillator 120.

The counters 140, 150 may be digital counters which count the frequency of the analog output signals of the oscillator 120 and provide digital output signals such as n-bit digital numbers. The digital numbers are compared in a comparator 160. If the numbers match, e.g., meet a predetermined value, a corresponding input voltage $V_{DDIN}$ is recorded. The comparator 160 may provide an output signal based on a pass/fail analysis. The output signal of the comparator 160 may be provided to the controller 105. The controller 105 may control the input signal to the voltage regulator 110 ($V_{DDIN}$). If the compared numbers do not match the input voltage $V_{DDIN}$ is adjusted, e.g., lowered, and the output frequency of the oscillator 120 based on the output voltage ($V_{OUT}$) of the voltage regulator 110 is again measured via counter 150 and compared to the reference voltage $V_{REF}$ at the comparator 160. This process is iterated until the output numbers of the counters 140, 150 match.

Matching may include a range. In fact, the oscillator 120 and counters 140, 150 do a sort of analog-to-digital conversion (ADC). Part of ADC is quantization as continuous range X is mapped to lower set of numbers in range Y and the quantization error (resolution), typically in bits, depends on design and its specifications. For instance, an 8-bit design may provide a 100 mV resolution, whereas a 16-bit design may provide a 10 mV resolution. Since the input of the comparator 160 is digital, it compares n-bit numbers. In other words, "matching" of the comparator 160 may depend on resolution of the oscillator 120 and the counters 140, 150. Accordingly, matching (and therefore passing) may mean that the measured $V_{OUT}$ is within a 200 mV range or a 500 mV range of the reference voltage $V_{REF}$. Alternatively, matching may mean that the measured $V_{OUT}$ is within a 20 mV range or a 50 mV range of that reference voltage.

The different elements (voltage regulator 110, oscillator 120, counters 140, 150, etc.) of the circuit 100 may be connected via conductive lines or a bus system. The elements may be directly connected to each other without any intervening elements in some embodiments.

The voltage regulator 110 may be a low dropout linear regulator (LDO) or a standard linear regulator. In other embodiment the voltage regulator 110 comprises other regulators. The LDO may regulate an output voltage that is powered from a higher voltage input. The LDO may require a minimum voltage across the regulator to maintain regulation.

Figure 2:
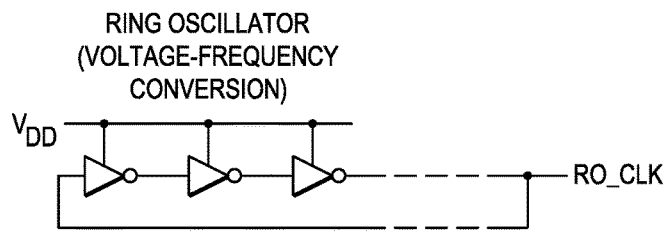
FIG. 2 shows a ring oscillator according to an embodiment.

The oscillator 120 may be a ring oscillator. In other embodiments the oscillator comprises a RC oscillator or a LC oscillator. An embodiment of a ring oscillator 120 is shown in FIG. 2. The ring oscillator 120 may be a multi stage ring oscillator. The ring oscillator 120 comprises an odd number of inverters connected in series to form a closed loop with positive feedback. In some embodiments the ring oscillator 120 may comprise three stages including a first inverter 202, a second inverter 204 and a third inverter 206. All inverters 202-206 are supplied by the supply voltage $V_{DD}$ or, as implement, by $V_{REF}$ or $V_{OUT}$. An output terminal of the first inverter 202 is connected to an input terminal of the second inverter 204 and the output terminal of the second inverter 204 is connected to an input terminal of the third inverter 206. An output signal of the last inverter 206 is fed back into the first inverter 202.

Figure 3:
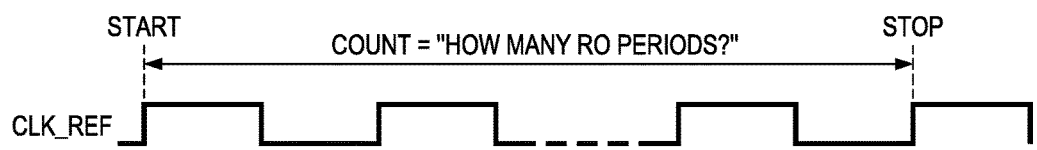
FIG. 3 shows a clock signal provided by the ring oscillator according to an embodiment.

When power is applied to the ring oscillator 120 the output terminal of the third inverter 206 provides a frequency signal such as a clock signal CLK. The oscillation frequency of the signal CLK depends upon the supply voltage $V_{DD}$. FIG. 3 shows an exemplary clock signal CLK provided at the output terminal of the oscillator 120. The clock signal may comprise any other periodic or recurring signal such as a sinus signal. In some embodiments, the ring oscillator 120 comprises NAND or NOR elements.

Figure 4:
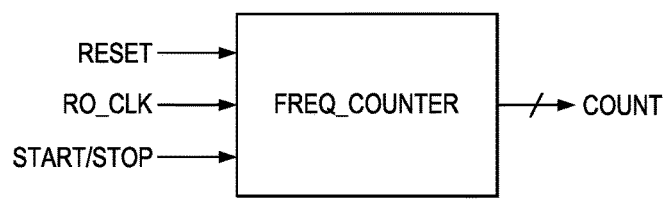
FIG. 4 shows a digital frequency counter according to an embodiment.

The counters 140, 150 may be digital frequency counters. In other embodiments the counters 140, 150 may be analog counters, timers or other devices that count recurring signal portions. FIG. 4 shows an embodiment of a digital frequency counter. The digital frequency counter 140, 150 counts the output frequency of the oscillator. The counter value directly corresponds to the frequency output of the oscillator.

The digital frequency counter may be based on the principle of counting the zero crossovers of a (continuous) signal. In alternative embodiments other principles may be used to count a continuous or periodic signal (such as a frequency). A digital frequency counter may comprise a mixer, a local oscillator frequency provided internally or externally, one or several multipliers and a digital counter. The counter in FIG. 4 comprises three input terminals and an output terminal. One of the input terminals receives the output signal of an oscillator such as oscillator 120. The other input terminals may be used for reset and start/stop. The output terminal may provide a digital number such as an n-bit number.

The comparator 160 may be an n-bit comparator. For example, the n-bit comparator may compare the digital frequency counter's outputs and if the two values of the counter's output are the same outputs itself a "1" and if the two values are not the same outputs a "0." The output signal of the comparator (logic signal) may be routed to the controller 105. The controller 105 may store the related voltages (input voltages ($V_{DDIN}$) of the voltage regulator 110) in an on-chip register or memory 107. In some embodiments the related voltages can be routed outside the chip (IC) via any multiplexed digital signal pin for observation on a tester.

In some embodiments the control circuit 115 can be dynamically connected to several voltage regulators (e.g., LDOs) on a chip (IC) 100. Accordingly, the control circuit 115 can control several LDOs. For example, a first LDO supplying a first voltage to a first voltage domain is connected to the control circuit 115 for a first period of time (via, e.g., a switch) wherein the control circuit 115 measures and compares an output voltage of the first LDO. Thereafter, a second LDO supplying a second voltage a second voltage domain is connected via, e.g., a second switch to the control circuit 115 for a second period of time in order to measure and control an output voltage of the second LDO and so on. In some embodiments the control circuit 115 can be implemented in software, hardware or partially in software and hardware.

The control circuit 115 may not comprise an I/O pin. The voltage can be tested or controlled within the chip (IC) 100 and without routing the test signal (through an I/O pin) away from the chip.

In other embodiments the circuit 115 may be used to test analog on-chip signals. For example, the circuit 115 can be modified by replacing the on-chip LDO 110 with an on-chip voltage regulator (IVR) or an on-chip switch mode power supply (SMPS). The circuit 115 may be used to measure or test any reference voltage such as a bandgap reference voltage or any voltage domains. Such architecture has the advantage that test costs are decreased and that the system is simplified.

The circuit 100 may be integrated with other device or element and placed as a module or component in a smartphone, mobile device, battery powered mobile device, battery powered wearable device, portable devices or wireless device to name just a few.

Figure 5:
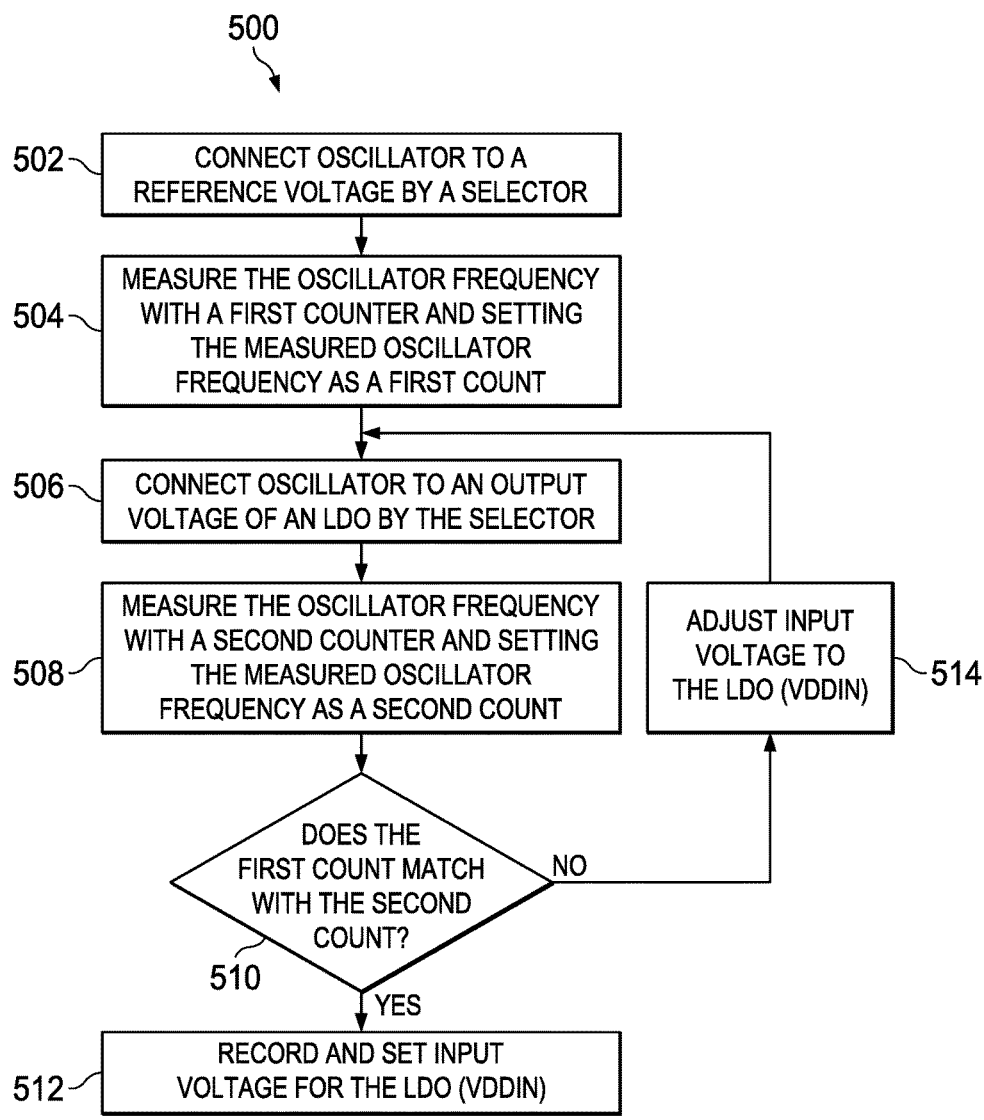
FIG. 5 shows a method of measuring a voltage signal according to an embodiment.

FIG. 5 shows a method 500 for calibrating and trimming an output voltage of a voltage regulator such as a low dropout voltage regulator (LDO) or on-chip LDO (OCLDO). The process starts at a first step 502 by connecting an oscillator such as a ring oscillator to an output voltage ($V_{OUT}$) of the voltage regulator via a selector (e.g., multiplexer, switches, etc.). For example, switch S2 disconnects the oscillator from an output terminal of the voltage regulator and switch S1 connects the oscillator to a reference terminal providing a reference voltage ($V_{REF}$). The oscillator produces an output frequency based on the reference voltage ($V_{REF}$). At the next step 504 the output frequency of the oscillator is measured by a first counter such as a first digital counter. The first counter provides a first count (e.g., an n-bit digital number) of the output frequency of the oscillator to a comparator.

In the next step 506 the oscillator is switched so that the reference voltage is disconnected from the reference voltage terminal and connected to the output voltage terminal of the voltage regulator. For example, the oscillator is disconnected from the reference voltage terminal by switch S1 and connected to the output voltage terminal of the voltage regulator via switch S2. Then the oscillator operates based on the input voltage of the voltage regulator ($V_{OUT}$) and provides a second output frequency. The higher the input voltage to the oscillator (output voltage of the voltage regulator) the higher output frequency of the oscillator and the lower the input voltage the lower the lower the output frequency of the oscillator. The second output frequency is measured again, this time by a second counter, e.g., a second digital counter. This is shown in process step 508. The measured second count (e.g., another n-bit digital number) of the second output frequency is provided to the comparator.

Next, the comparator compares the two counts in decision block 510. When the first count is the same as the second count the input $V_{DDIN}$ to the voltage regulator is recorded in step 512. When the first count is not the same as the second count the input voltage $V_{DDIN}$ is adjusted (e.g., decreased or increased) in step 514. When the input voltage $V_{DDIN}$ is adjusted (such as decreased) the oscillator frequency of the input voltage $V_{DDIN}$ is measured again by the second counter and the second count is forwarded to the comparator which again compares the first count (based on the reference voltage, $V_{REF}$) with the second count (based on the output voltage of the voltage regulator, $V_{OUT}$). When the first count and the second count match the input voltage $V_{DDIN}$ is recorded and when the counts do not match the process is again iteratively repeated via processing/decision steps 508/510 until the values match.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for controlling a supply voltage, the method comprising:
   generating a first periodic signal by a reference voltage to an oscillator;
   generating a second periodic signal by the supply voltage of a voltage source to the oscillator;
   measuring first periods of the first periodic signal, the first periods measured as a first count;
   measuring second periods of the second periodic signal, the second periods measured as a second count; and
   comparing the first count with the second count.

2. The method according to claim 1, wherein the voltage source is a voltage regulator.

3. The method according to claim 2, further comprising storing an input voltage of the voltage regulator when the first count and the second count match.

4. The method according to claim 2, further comprising adjusting an input voltage of the voltage regulator when the first count and the second count do not match.

5. The method according to claim 4, wherein adjusting the input voltage of the voltage regulator comprises lowering the input voltage.

6. The method according to claim 2, wherein the voltage regulator is an on-chip low dropout regulator (OCLDO).

7. The method according to claim 1, wherein the oscillator is a ring oscillator.

8. The method according to claim 1, further comprising:
generating a further second periodic signal by a further output voltage of a further voltage source to the oscillator;
measuring further second periods of the second periodic signal, the further second periods measured as a further second count; and
comparing the first count with the further second count.

9. The method according to claim 1, wherein the first periodic signal and the second periodic signal are continuous signals.

10. A circuit comprising:
an oscillator configured to generate a first periodic signal from a first incoming signal and a second periodic signal from a second incoming signal;
a counter connected to the oscillator, the counter configured to count first periods of the first periodic signal and second periods of the second periodic signal; and
a comparator connected to the counter, the comparator configured to compare a first count of the first periods of the first periodic signal with a second count of the second periods of the second periodic signal.

11. The circuit according to claim 10, further comprising a voltage regulator, wherein the voltage regulator is configured to receive an input signal and provide the second incoming signal, and wherein the second incoming signal is a voltage output signal.

12. The circuit according to claim 11, further comprising a first selector located between the voltage regulator and the oscillator, the first selector configured to connect the first incoming signal to the oscillator and not connect the voltage output signal to the oscillator during a first period of time, and to connect the voltage output signal to the oscillator and not connect the first incoming signal to the oscillator during a second period of time.

13. The circuit according to claim 12, wherein the first incoming signal is a reference signal ($V_{REF}$).

14. The circuit according to claim 12, further comprising a second selector located between the oscillator and the counter, the second selector to provide the first periodic signal to a first counter of the counter and a second periodic signal to a second counter of the counter.

15. The circuit according to claim 11, further comprising a controller connected to the comparator and to the voltage regulator, wherein the controller adjusts the input signal when the first count and the second count do not match, and wherein the controller stores the input signal in a storage device when the first count and the second count match.

16. The circuit according to claim 14, wherein the first selector is a multiplexer (MUX) and the second selector is a demultiplexer (DEMUX).

17. The circuit according to claim 14, wherein the first selector is a first switch and the second selector is a second switch.

18. A method for controlling a supply voltage, the method comprising:
generating a first recurring signal by a reference voltage to an oscillator;
generating a second recurring signal by the supply voltage of a voltage source to the oscillator;
counting first recurring events of the first recurring signal, the first events counted as a first count;
counting second recurring events of the second recurring signal, the second events counted as a second count; and
comparing the first count with the second count.

19. The method according to claim 18, wherein the voltage source is a voltage regulator.

* * * * *